United States Patent
Nakamura

[19]

[11] Patent Number: 5,875,270
[45] Date of Patent: Feb. 23, 1999

[54] IMAGE DISPLAY DEVICE

[75] Inventor: Yoshimasa Nakamura, Yamatokoriyama, Japan

[73] Assignee: Sharp Kabushiki Kaisha, Osaka, Japan

[21] Appl. No.: 862,469

[22] Filed: May 23, 1997

[30] Foreign Application Priority Data

May 28, 1996 [JP] Japan .................................. 8-133847

[51] Int. Cl.⁶ .................................................. G06K 9/36
[52] U.S. Cl. ..................................................... 382/232
[58] Field of Search ................................... 382/232, 233, 382/234, 235, 238, 239, 240, 243; 358/261.1, 261.2, 261.3, 261.4, 431; 348/384, 390; 345/141, 156, 501, 507, 509, 515, 192, 194, 202, 203

[56] References Cited

U.S. PATENT DOCUMENTS

| | | | |
|---|---|---|---|
| 3,618,032 | 11/1971 | Goldsberry et al. | 345/141 |
| 4,118,695 | 10/1978 | Ogawa et al. | 345/160 |
| 5,408,328 | 4/1995 | Boliek et al. | 358/261.4 |
| 5,566,283 | 10/1996 | Modegi et al. | 395/126 |

FOREIGN PATENT DOCUMENTS 4-76673  3/1992  Japan .............................. G06F 15/40

*Primary Examiner*—Jose L. Couso
*Attorney, Agent, or Firm*—Nixon & Vanderhye, P.C.

[57] ABSTRACT

The image display device of the present invention includes a clear code detecting section for detecting a clear code that is input in an arbitrary position beforehand in a compressed image file when carrying out decompression, a status information extracting section for extracting status information of the clear code, an information storing section for storing the clear code and the status information of the clear code, a stored information searching section for searching a clear code nearest to a partial decompression start position from the status information upon receiving a request for partial decompression, and a partial decompression starting section which determines the partial decompression start position in the compressed image file, and subsequently starts decompression from the partial decompression start position. The described arrangement permits an intermediate access to the compressed image file of dictionary self-updating type, thereby realizing high speed decompression while reducing a required memory capacity to minimum.

11 Claims, 13 Drawing Sheets

FIG. 3 (a)

STATUS INFORMATION TO BE EXTRACTED AND STORED UPON DETECTING ONE CLEAR CODE

| current_bit_size | CURRENT BIT LENGTH |
|---|---|
| left_bytes | NUMBER OF BYTES LEFT IN COMPRESSED CODE STORING BUFFER |
| current_byte | CURRENT BYTE |
| left_bits | EFFECTIVE NUMBER OF BITS IN CURRENT BYTE |
| offset_pixels | POSITION IN COMPRESSED IMAGE (WHERE IN THE PIXELS?) |
| offset_bytes | POSITION IN COMPRESSED CODE (WHERE IN THE BYTES?) |

FIG. 3 (b)

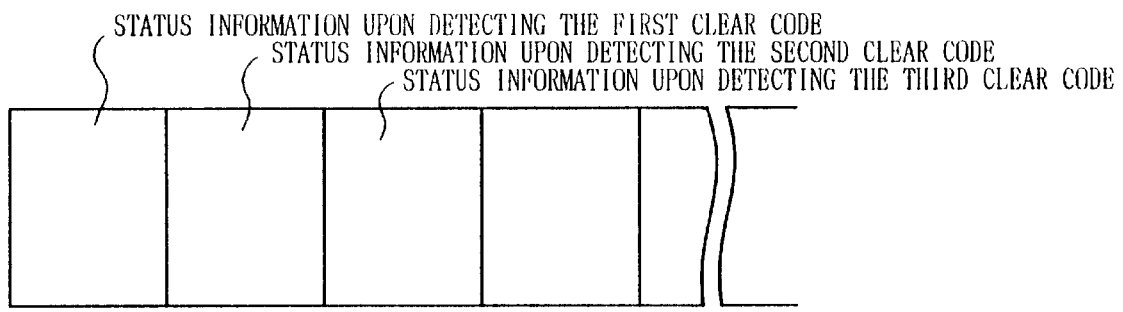

STATUS INFORMATION UPON DETECTING THE FIRST CLEAR CODE
STATUS INFORMATION UPON DETECTING THE SECOND CLEAR CODE
STATUS INFORMATION UPON DETECTING THE THIRD CLEAR CODE

F I G. 8

```
switch(direction) {
    case    1:  /* REQUEST FOR SCROLLING TO THE RIGHT *
        if((vlen = screen_width - ¥
                    scx - scw - ¥
                    len) < 0)  {
            vlen = screen_width - scx - scw;
        }
        else
            vlen = len;
        break;
    case    2:  /* REQUEST FOR SCROLLING TO THE LEFT *
        if((vlen = scx - len) < 0)    {
            vlen = scx;
        }
        else
            vlen = len;
        break;
    case    3:  /* REQUEST FOR SCROLLING DOWN *
        if((vlen = screen_height - ¥
                    scy - sch - ¥
                    len) < 0)  {
            vlen = screen_height - scy - sch;
        }
        else
            vlen = len;
        break;
    case    4:  /* REQUEST FOR SCROLLING UP *
        if((vlen = scy - len) < 0)    {
            vlen = scy;
        }
        else
            vlen = len;
        break;
    fault:
        return(-1);
}

/*
```

F I G. 9

```
* DETERMINE AN AMOUNT OF SHIFT ON SCREEN
*/
buff = vlen;
while(buff) {
    switch(direction) {
        case    1:
            if(vmap[scx + buff -1])
                vram_count++;
            break;
        case    2:
            if(vmap[scx + buff])
                vram_count++;
            break;
        case    3:
            if(hmap[scy + buff -1])
                vram_count++;
            break;
        case    2:
            if(hmap[scx + buff])
                vram_count++;
            break;
    }
    buf-;
}
/*
 *SAVE WORK
 */
sscx = scx;
sscy = scy;
sscw = scw;
ssch = sch;
sbmx = bmx;
sbmy = bmy;
sbmw = bmw;
sbmh = bmh;

```
* RENEW WORK (REGION TO BE DISPLAYED ON SCREEN AFTER SCROLLING)
*/
switch(direction) {
    case    1:
        sscx += vlen
    break;
    case    2:
        sscx -= vlen
    break;
    case    3:
        sscy += vlen
    break;
    case    4:
        sscy -= vlen
    break;
}

/*
 * RENEW WORK (REGION TO BE ACTUALLY DECOMPRESSED)
 */
switch(direction) {
    case    1:
        if(vlen < scw)  {
            /* DECOMPRESSED FROM */
            scx += scw;
            scw = vlen;
            /* DECOMPRESSED TO */
            bmx = bmx + bmx - vram_count;
            bmw = vram_count;
        }
        else    {
            /* DECOMPRESSED FROM */
            scx += vlen;
        }
    break;
```

FIG. 11

```
       case    2:
              if(vlen < scw)    {
                     /* DECOMPRESSED FROM */
                     scx -= vlen;
                     scw = vlen;
                     /* DECOMPRESSED TO */
                     bmw = vram_count;
              }
                else  {
                     /* DECOMPRESSED FROM */
                     scx -= vlen;
              }
       break;

case    3:
              if(vlen < sch)    {
                     /* DECOMPRESSED FROM */
                     scy = scy + sch;
                     sch = vlen;
                     /* DECOMPRESSED TO */
                     bmy = bmy + bmh - vram_count;
                     bmh = vram_count;
              }
                else  {
                     /* DECOMPRESSED FROM */
                     scx += vlen;
              }
       break;

case    4:
              if(vlen < sch)    {
                     /* DECOMPRESSED FROM */
                     scy -= vlen;
                     sch = vlen;
                     /* DECOMPRESSED TO */
                     bmh = vram_count;
              }
                else  {
                     /* DECOMPRESSED FROM */
                     scx -= vlen;
              }
       break;
}
```

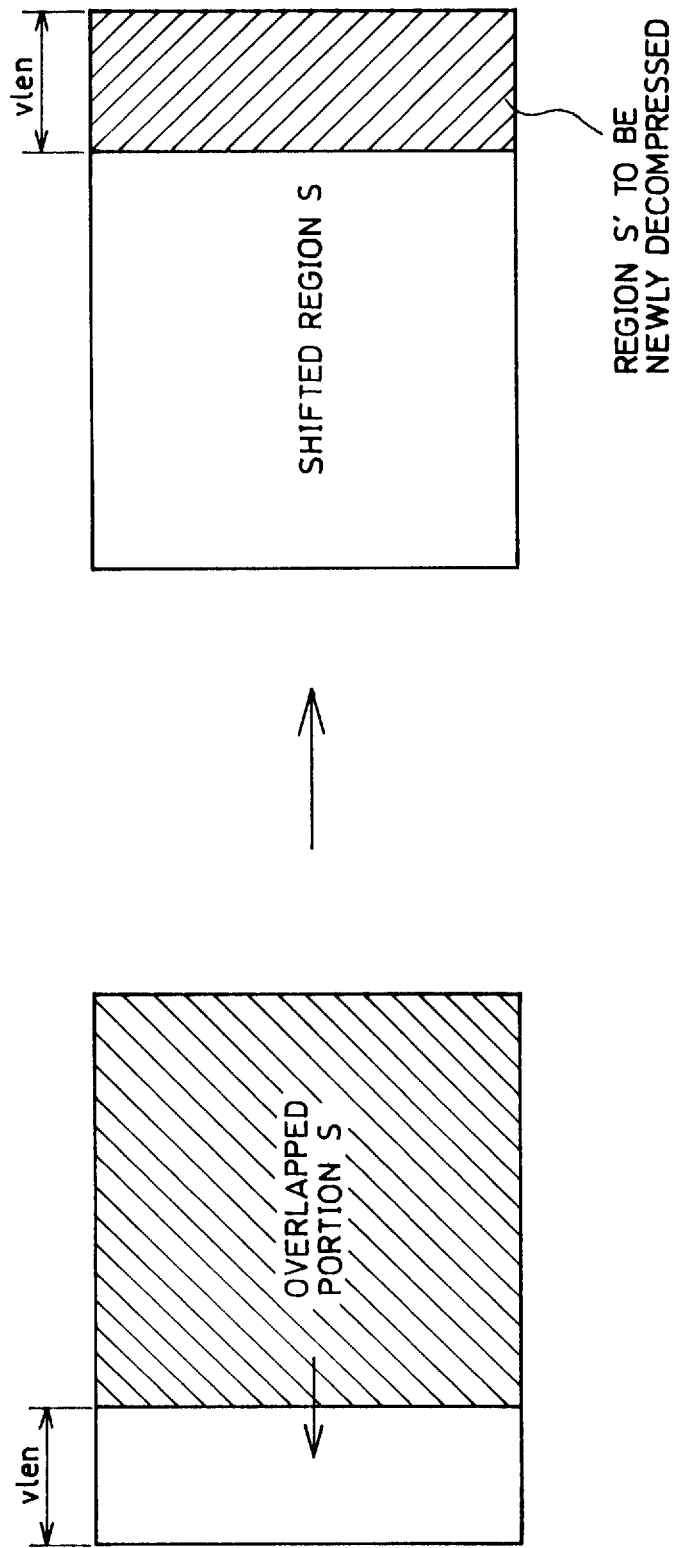

IMAGE DISPLAY DEVICE

FIELD OF THE INVENTION

The present invention relates to an image display device for displaying a compressed image, for use in an information terminal or a portable terminal, for example, for connection in a network such as the Internetwork, etc., and particularly relates to an image display device which enables an improved partial display system of the compressed image.

BACKGROUND OF THE INVENTION

An image display device for use in not only personal computers and workstations but also in portable information terminals generally have a display scrolling function. The display scrolling function is provided for moving an image displayed within a window display region when image data to be displayed can not fit the display or inside the window display.

On the other hand, the GIF (Graphics Interchange Format), which is one of standard image formats on the Internetwork, employs a compression/decompression system of a dictionary self-updating type using the LZW (Lempel Ziv Welch) system. In the compression/decompression system of a dictionary self-updating type adopted by the LZW system, the corresponding character string updates based on the entry number corresponding to the character string that has appeared in the past and was registered in the dictionary. The LZW system is disclosed in Japanese Examined Patent Publication No. 68893/1993 (Tokukohei 5-68893), and will be described in detail later under embodiments.

In this decompression system of the LZW system, it is always required to decompress the compressed image data from the beginning. Therefore, when an attempt is made to display in a rectangular portion, a part of the compressed image using the self-updating dictionary represented by the GIF, i.e., to display a rectangular portion of the image data file (image file) as extracted, if there is a sufficient memory capacity, only the rectangular portion as requested may be transferred to the video memory, etc., each time, after once decompressing the entire image.

However, devices with a small memory capacity such as a portable information terminal, adopt such partial rectangular display system that a portion in a compressed image file corresponding to a requested rectangle is decompressed on demand, thereby saving the memory. In this arrangement, by the described features of the compression/decompression system, the compressed image file is decompressed always from the beginning, and the decompression of the file corresponding to the requested rectangle is performed by searching a display start coordinate.

However, the described conventional image display devices have such a drawback that the closer is the portion to be decompressed to the end of the image file, a longer decompression time is required to reach the portion to be decompressed. For this reason, on the display screen, the closer is the rectangular portion as requested to the lower right corner of the display screen, the longer is the time required for reaching the rectangular portion as requested and displaying the image corresponding to the rectangular portion, which may be annoying for some users.

SUMMARY OF THE INVENTION

The present invention is achieved in finding a solution to the above-mentioned problem, and accordingly it is an object of the present invention to provide an image display device which permits a high speed decompression using a minimum memory capacity by enabling an intermediate access to a compressed image file using a self-updating dictionary.

In order to achieve the above-mentioned object, the image display device of the present invention is characterized by including a display section for displaying image data, a decompressor for decompressing a compressed image file that is a file of compressed data of a dictionary self-updating type and making the compressed image file the image data, a clear code detecting section for detecting a clear code that is input in an arbitrary position beforehand in the compressed image file so as to reset contents of a self-updating dictionary when carrying out decompression, a status information extracting section for extracting status information in the decompressor upon detecting the clear code, the status information including information indicative of a position of the clear code in the compressed image file, an information storing section for storing the clear code as detected and the status information of the clear code as extracted, a stored information searching section for searching a clear code nearest to a partial decompression start position from its status information stored in the information storing section upon receiving a request for partial decompression of the compressed data, and a partial decompression starting section, which makes an access to an offset position in the compressed image file as searched by the stored information searching section, shifts bits to obtain the partial decompression start position from the offset position, and subsequently starts decompression from the partial decompression start position.

In the conventional decompression system of a dictionary self-updating type, as it is required to decompress the compressed data from the beginning of the file, an effective intermediate access to the file cannot be realized.

In order to counteract the described problem associated with the conventional arrangement, the decompression system of a dictionary self-updating type is arranged such that first the clear code detecting section reads out the compressed image file from the beginning to the end, and detects a clear code that is input beforehand in an arbitrary position in the compressed image file to reset the contents of the self-updating dictionary.

On the other hand, the status information extracting section extracts status information on the decompressor including the information indicative of the position of the clear code in the compressed image file upon detecting the clear code. The clear code as detected and the status information as extracted are stored in the information storing section.

Here, upon receiving a request for a partial decompression of the compressed data, first the stored information searching section searches the clear code nearest to a partial decompression start position from the status information stored in the information storing section.

Then, the partial decompression starting section accesses an offset position in the compressed image file as searched by the stored information searching section, and shifts bits to obtain the partial decompression start position based on the offset position. Then, the partial decompression starting section starts decompression from this partial decompression start position.

As a result, partial decompression by making an intermediate access to the compressed image file is realized with respect to the compressed image file of a dictionary self-updating type. Furthermore, by enabling the described partial decompression, a required memory capacity can be reduced to minimum, and a high speed decompression can be realized.

According to the described image display device, in order to enable high speed partial decompression, the compressed image file is once read in to the end, and the information is detected and extracted as requested. Therefore, even with respect to the image that is to be displayed only partially, a long time is required for the initial process of detecting and extracting the information as required, i.e., the status information etc., from the entire compressed image file.

For example, assume that it takes 10 seconds for detecting and extracting necessary information of an image having a dot size of 1024×1024, although it takes only 2.5 seconds for displaying a region of an upper left corner having a dot size of 256×256, it takes 10 seconds for the initial process of detecting and extracting the information as required.

In order to solve the above-mentioned problem, another image display device of the present invention is characterized by including a display section for displaying image data, a decompressor for decompressing a compressed image file that is a file of compressed data of a dictionary self-updating type and making the compressed image file the image data, a clear code detecting section for detecting a clear code that is input in an arbitrary position beforehand in the compressed image file so as to reset contents of a self-updating dictionary when carrying out decompression, a status information extracting section for extracting status information in the decompressor upon detecting the clear code, the status information including information indicative of a position of the clear code in the compressed image file, an information storing section for storing the clear code as detected and the status information of the clear code as extracted, a stored information searching section for searching a clear code nearest to a partial decompression start position from its status information stored in the information storing section upon receiving a request for partial decompression of the compressed data, a partial decompression starting section, which makes an access to an offset position in the compressed image file as searched by the stored information searching section, shifts bits to obtain the partial decompression start position from the offset position and subsequently starts decompression from the partial decompression start position, and a control section which, in response to the request for partial decompression of the compressed data, controls the clear code detecting section so as to detect the clear code with respect to a predetermined region as requested in the compressed image file and controls the partial decompression starting section so as to carry out partial decompression with respect to the predetermined region as requested, while, upon completion of the partial decompression with respect to the predetermined region as requested, controls the stored information searching section so as to search for an additional clear code with respect to a predetermined additional region as requested and controls the partial decompression starting section so as to carry out partial decompression with respect to the predetermined additional region as requested.

According to the above arrangement, upon receiving a request for partial decompression of compressed data, the control section controls, with respect to a predetermined requested region in the compressed image file, the clear code detecting section so as to search for a clear code and controls the partial decompression starting section so as to carry out partial decompression, and upon completion of the partial decompression, with respect to the predetermined region as requested, the control section controls, with respect to the predetermined additional region as requested, the stored information searching section to search for an additional clear code and controls the partial decompression starting section to carry out partial decompression with respect to the predetermined additional region as requested.

Namely, with respect to the region requested to be decompressed, decompression is started based on the information already stored in the information storing section. However, as the decompression proceeds, upon reaching a region yet to be decompressed, the decompression proceeds as the information is successively added in the information storing section.

According to the described arrangement, since the control section reads in the status information based on the clear code one after another, it is permitted to store each time only the status information required for scrolling with decompression that is to be carried out from the decompression start position, for example, per 10 to 50 dots. As a result, a time required for the first display can be reduced to a time required for decompression of a region of around 256×256 dots. As this eliminates such problem that a long time is required for extracting the first status information contents caused by reading contents in other region than the region to be decompressed as requested, a constant decompression time can be achieved.

For a fuller understanding of the nature and advantages of the invention, reference should be made to the ensuing detailed description taken in conjunction with the accompanying drawings.

BRIEF DESCRIPTION OF THE DRAWINGS

FIG. 3(a) is an explanatory view showing the contents of status information stored in the information storing section of the image display device; and FIG. 3(b) is an explanatory view showing respective states of the status information stored in the image storing section of the image display device;

FIG. 8 is a program showing processes of an operation by a decompression region correcting section;

FIG. 9 is a program showing processes of an operation by the decompression region correcting section following the program shown in FIG. 8;

FIG. 10 is a program showing processes of an operation by the decompression region correcting section following the program shown in FIG. 9;

FIG. 11 is a program showing processes of an operation by the decompression region correcting section following the program shown in FIG. 10;

FIG. 12 is a drawing explaining an overlapped image shifting process when scrolling to the right.

DESCRIPTION OF THE EMBODIMENT

The following will explain one embodiment of the present invention in reference to FIG. 1 through FIG. 13.

Figure 2:
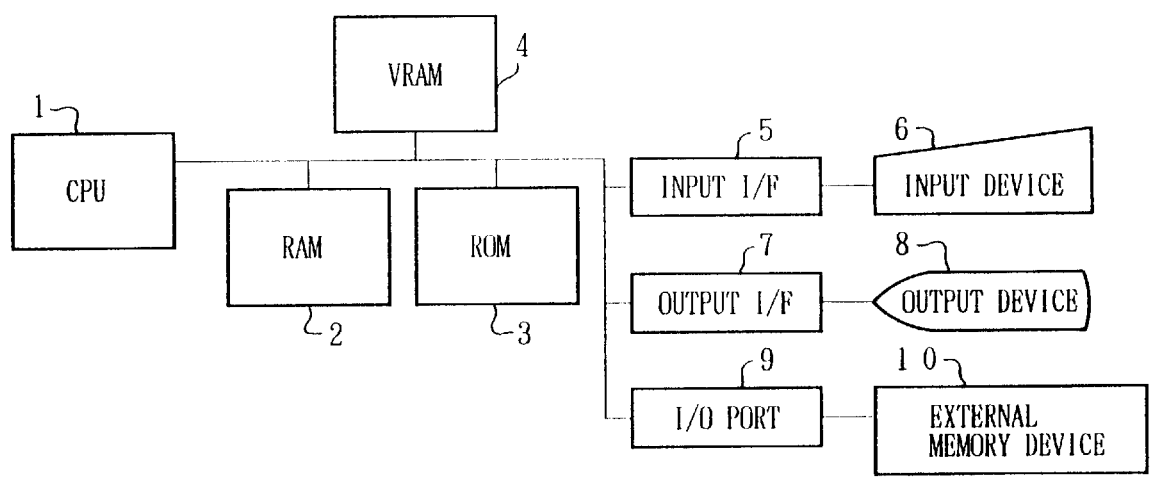
FIG. 2 is a block diagram showing an entire structure of the image display device.

An image display device of the present embodiment is applicable to, for example, an image display of personal computers. As shown in FIG. 2, the image display device includes hardware such as a CPU (Central Processing Unit) 1, a RAM (Random Access Memory) 2, a ROM (Read Only Memory) 3, and a VRAM (Video RAM) 4, etc. To the CPU 1, connected are an input device 6 via an input I/F (Interface) 5, an output device 8 via an output I/F (Interface) 7 and an external memory device 10 via an I/O (Input/Output) port 9 respectively.

Figure 1:
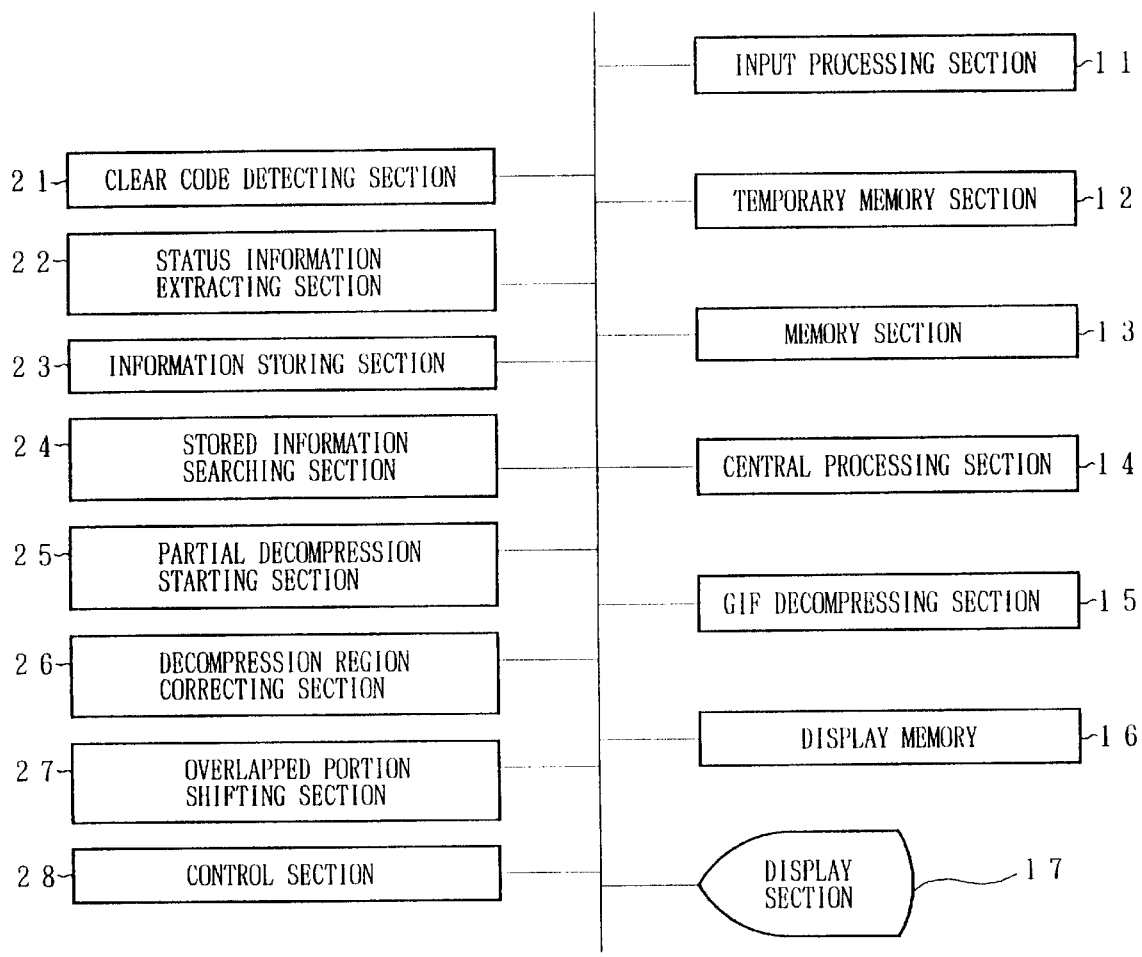
FIG. 1 is a block diagram showing a control system in an image display device in accordance with one embodiment of the present invention.

As shown in FIG. 1, a control system for controlling the described components in the hardware includes an input processing section 11, a temporary memory section 12, a memory section 13, a central processing section 14, a GIF (Graphics Interchange Format) decompressing section 15, a display memory 16 and a display section 17. The control system also includes sections to be controlled by the central processing section 14 such as a clear code detecting section (detecting section) 21, a status information extracting section (extracting section) 22, an information storing section 23, a stored information searching section 24, a partial decompression starting section 25, a decompression region correcting section 26, an overlapped portion shifting section 27 and a control section 28.

The input processing section 11 is composed of a keyboard, the input device 6 such as an OCR (Optical Character Reader) and a pen etc., and the input I/F 5 for communicating with the computer. Requests for decompressing an image and scrolling a displayed image are respectively input to the input processing section 11 which then outputs the request for scrolling.

For the temporary memory section 12 and the memory section 13, a generally adopted normal memory device for computers composed of the RAM 2, the ROM 3, etc., is adopted. The temporary memory section 12 and the memory section 13 store data including an execution program for extracting and searching information as requested and the results of the search. For the memory section 13, an external memory device 10 such as a floppy disk, a hard disk, a CDROM (Compact Disk ROM), etc., may be adopted through the I/O port 9 for communicating with the computer.

The display memory 16 which corresponds to the VRAM 4 is a memory for storing decompressed image data only. The image data stored in the display memory 16 are displayed on the output device 8 such as a CRT (Cathode-Ray Tube) or a liquid crystal display etc., through the output I/F 7 on demand. Therefore, the output device 8 functions as the display section 17.

The GIF decompressing section 15 functions as a decompressor for decompressing compressed image file, i.e., a file of the GIF compressed image data. The GIF is a standard image format defined by CompuServe, i.e., a personal computer communication network in the United States, and in the GIF, a LZW (Lempel Ziv Welch) system of a dictionary self-updating type is adopted as a compression/decompression system. The described compressed image file is prepared by compressing the image data by the LZW, and the resulting compressed image file is decompressed as need arises.

The image display device of the present embodiment is also arranged so as to permit such interruption request: While observing an operation by the GIF decompressing section 15, the information is extracted from the compressed image file as need arises, and stored, and the information is searched as requested. Then, based on the result of search, a request is given to the GIF decompressing section 15 to be executed by the control section 28 and the partial decompression starting section 25.

The specification of the described GIF is available from the CompuServe, and thus detailed explanations thereof shall be omitted here.

The compression/decompression system of a dictionary self-updating type adopting the LZW system is a known technique; however, brief explanations thereof will be given below.

The LZW system adopts the compression/decompression system of a dictionary self-updating type. The basic concept of this system lies in that the corresponding character string is replaced based on the entry number corresponding to the character string that has appeared in the past and was registered in the dictionary. For example, suppose that a character input is c, and a registered character is s, then the LZW system has the following algorithm: Input characters c are sequentially read, and if an input character c has not registered in the dictionary, the entry number corresponding to the character string that has been registered is output in a form of a compressed code, and new character input is registered in the dictionary as a new entry number to be added to the list of the entry numbers, and the newly registered character string is used for the subsequent compression. The described algorithm are explained below in detail.

For simplicity, assume that the input data are limited from 0 to 7, and a character string to be compressed is "3 1 1 3 1 2". Then, in the compression system of the present embodiment, the table (first dictionary) is initialized as follows. In the GIF standard, the table has the upper limit entry number of 4096.

| Table Contents |
|---|
| table [0] = 0 |
| table [1] = 1 |
| table [2] = 2 |
| table [3] = 3 |
| table [4] = 4 |
| table [5] = 5 |
| table [6] = 6 |
| table [7] = 7 |
| table [8] = empty (or initialized by −1 etc.) |
| table [9] = empty (or initialized by −1 etc.) |
| . |
| . |
| . |

In this example, the first character input c is "3". As "3" is stored at an address "3" in the table, the table number (dictionary number) "3" where the registered character string s assigned to "3" is stored is registered.

The next character input c is "1". Since the data "3 1" obtained by connecting the registered character string s and the character input c has not been registered in the table, the registered table number "3" is read out, and "3 1" is added to the dictionary at table number "8". The next character string s to be registered is "1".

The third character input c is also "1". Since the data "1 1" obtained by connecting the registered character string s and the character input c has not been registered in the table, the registered table number "1" is read out, and "1 1" is added to the dictionary at table number "9". The next character string s to be registered is "1".

The fourth character input c is "3". Again, as the data "1 3" has not been registered in the table, the registered table number "1" is read out, and "1 3" is added to the dictionary at table number "10". The next character string s to be registered is "3", and the corresponding table number "3" is stored.

The fifth character input c is "1". Since the character string s is "3", the data obtained by connecting the registered character string s and the input character c is "3 1". Since this data has already been registered at the table number "8", the next registered character string s to be registered is "3 1", and it is checked to see if a match of a longer character string exists before outputting the compressed code.

The sixth character input c is "2". The data obtained by connecting the registered character string s and the input character c is "3 1 2". Since this data has not been stored in the table, the table number "8" which gives the match of the longest character string is read out, and "3 1 2" is registered at a dictionary number "11", and the next character string s to be registered is "2", and this table number "2" is stored. Therefore, the original data "3 1 2" is compressed to the data "8 2".

As all the characters have been input, the newest table number "2" is read out. As a result, it can be seen that in response to the input of 6 characters "3 1 1 3 1 2", only 5 characters "3 1 1 8 2" are output. The described compression system is a so-called "decompression of dictionary self-updating type", wherein a compressed code consists of 5 characters as compressed data in the described example.

Next, a decompression system for decompressing the described compressed code will be explained. In the same manner as the compression system, the compressed code is decompressed while updating a dictionary (second dictionary).

The decompression system is based on a simple principle. That is, first, the compressed code is input, and then the content of the dictionary (character string) corresponding to the compressed code is recovered. To be specific, the data string compressed code) "3 1 1 8 2" resulting from the described compression system is recovered to obtain the compressed data "3 1 1 3 1 2" in the following manner. Namely, the dictionary building up process in the decompressing process completely corresponds to the dictionary building up process in the compression system.

| COMPRESSED CODE | DATA TO BE ADDED TO THE DICTIONARY | OUTPUT CODE |
| --- | --- | --- |
| 3 | | |
| 1 | 8: "3 1" | 3 |
| 1 | 9: "1 1" | 1 |
| 8 | 10: "1 3" | 1 |
| 2 | 11: "3 1 2" | 3 1 |
| END | | 2 |

As described, the present embodiment employs the above-explained compression/decompression system of a dictionary self-updating type.

It should be noted here that although the present embodiment employs the GIF system as an image forming system, the present invention is not limited to this, and is applicable to any data associated with the compressing/decompressing process of a dictionary self-updating type.

In contrast, for example, Japanese Unexamined Patent Publication No. 76673/1992 (Tokukaihei 4-76673) discloses a technique for enabling a divided accessing process for MH (Modified Huffman) coded data. However, this technique is not effective for the compression/decompression system of a dictionary self-updating type. Namely, a decompression table in the MH is fixed, and a recovered code and a compressed code have one to one correspondence. Furthermore, the compressed code is expressed in 12 bits at maximum, and thus, the corresponding decompression system is required to process only 4096 kinds of data. As these data are simple digital data, it is not difficult to store all the data.

However, the compression/decompression system in the GIF is based on the LZW system of a dictionary having a maximum number of entries of 4096. Further, among the 4096 entries, the number of empty entries or the contents of the entries (second dictionary) are subjected to change during the process of decompressing the same image. Furthermore, the dictionary updates in a different manner as the content of the image is changed.

Therefore, in order to enable the access per 16 rasters as disclosed in the Japanese Unexamined Patent Publication No. 76673/1992 (Tokukaihei 4-76673), the dictionary content at an access permitting position, i.e., the content of the conversion table is required to be stored each time, thereby requiring a large memory capacity. Specifically, since a memory of 4 to 5 bytes is used for an entry of one item, a table having 240K to 300K bytes is required in order to enable the access per 16 rasters for an image composed of 320×240 pixels.

The image display device in accordance with the present embodiment, as will be mentioned later, has such beneficial feature that a memory capacity of only a few K bytes is required.

The central processing section 14 reads out various data or codes on demand, into the temporary memory section 12, from the clear code detecting section 21, the status information extracting section 22, the information storing section 23, the stored information searching section 24, the partial decompression starting section 25, the decompression region correcting section 26, the overlapped portion shifting section 27 and the control section 28. Then, the central processing section 14 interprets the data as read out and converts them.

The clear code detecting section 21 detects a clear code from the compressed image file. Namely, a "clear code" for resetting the contents of the updating dictionary is specified in the compressed image file in the GIF. The clear code is input into the compressed image file at arbitral timing in the process of making the compressed image file, in other words, in the process of compressing the image data.

The clear code may be input at arbitral timing in the compressing process as described; however, when reading the clear code in the decompressing process, it is required to reset the self-updating immediately. By inputting the clear code in the described manner, the memory capacity required for the dictionary (table) can be reduced.

A CLEAR CODE VALUE, which is the actual value of the clear code, varies depending on an image. Specifically, it is set according to the corresponding number of colors used in the image, and the CLEAR CODE VALUE is given by the following equation:

CLEAR CODE VALUE=COLORS

For example, a CLEAR CODE VALUE for displaying an image in 16 colors in one time is 16.

In the LZW system adopted in the compressed image file in the GIF, a variable compressed code of "variable length" is output as a result of compression. Namely, according to the compressed image file in the GIF, a compressed code is expressed in a small number of bits when the number of entries is small; whereas, the compressed code is expressed in a large number of bits when the number of entries is large as the compression proceeds. The same can be said for the decompression process. For this reason, it is required to recognize the number of bits being used in the current compressed code during the decompression process.

Therefore, under the above condition, the information storing section 23 in accordance with the present embodiment controls the following 6 items as status information including the clear code and its position as shown in FIG. 3(a).

(1) current_bit_size

As descried, as a result of compressing the image file in GIF using the LZW system, the compressed code of a "variable length" is output. On the other hand, the current_bit_size indicates a variable for use in controlling the current bit length expressing the compressed code. For example, in the case where the current_bit_size is 4, the dictionary number in the self-updating dictionary is expressed in 4 bits, and further the compressed code is expressed by this table number of 4 bits.

(2) left_bytes

The compressed code in an image portion corresponding to the image data in the compressed image file in the GIF is composed of a block of not more than 256 bytes. The size of the block is denoted at the beginning of each block. For example, when the size of the block is "0", this indicates the end of the compressed code in the image portion. Therefore, in the decompressing process, it is convenient to store the compressed code of the image portion in the buffer (temporary memory 12, etc.) as a block. The left_bytes are variables for use in controlling the number of bytes currently remaining in the buffer.

(3) current_byte

The current_byte is a variable for use in storing the value of the first byte in each block in the compressed code being processed.

(4) left_bits

The left_bits are variables for use in controlling unprocessed bits in the first byte being processed. For example, in the case where the number of the left_bits is 5, as this indicates that the first 3 bits have already been processed, in order to read out a subsequent compressed code from the current_byte, it is required to shift 3 bits.

(5) offset_pixels

The offset_pixels are variables for use in storing the number of pixels from the beginning in the image data that have been decompressed. Upon receiving a request for scrolling with decompression, a position of a start coordinate for the decompression can be computed. Therefore, for example, when the start coordinate for decompression is denoted as (x, y) with respect to the origin at the left upper corner of the image, and the dot size in the horizontal direction of the image is denoted as a SCREEN WIDTH, a number of a START PIXEL for decompression is given by the following formula:

START PIXEL=x+SCREEN WIDTH*y.

While comparing the START PIXEL with the offset_pixels, the stored information searching section 24 searches the offset_pixels nearest to the START PIXEL within the range not exceeding the start pixel.

(6) offset_bytes

The offset_bytes are variables for use in controlling the offset position on the compressed image file.

The described items (1) through (6) respectively have one to one correspondence with a clear code. Therefore, for example, in the case where 256 clear codes are contained in one compressed image file in the GIF, in order to enable an intermediate access to any of these clear codes in the image display device of the present invention, 256 arrangements are required. Therefore, a memory capacity in the order of around several K bytes is required. The structure of the data stored in the information storing section 23 is as shown in FIG. 3(b).

Figure 4:
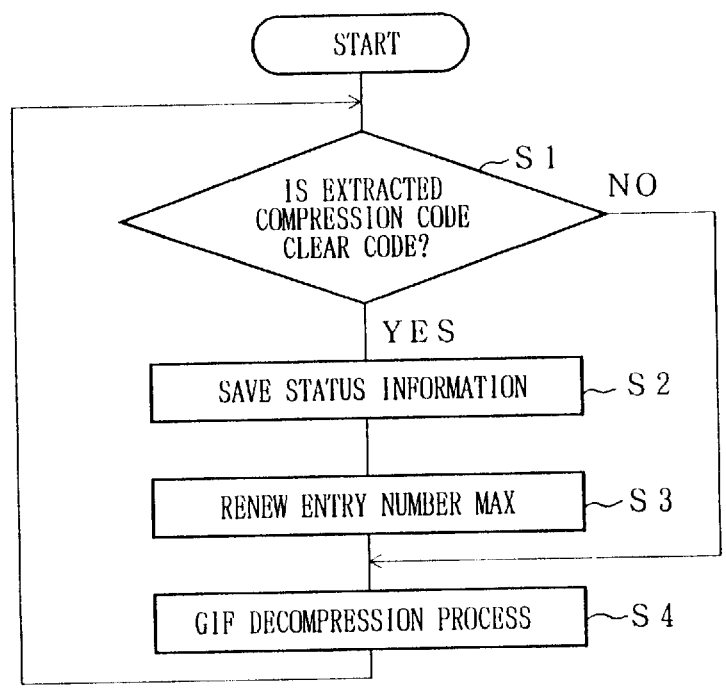
FIG. 4 is a flowchart explaining processes of an operation by the status information extracting section for the GIF decompression system.

Next, the status information extracting section 22 extracts the status information composed of the described items (1) through (6) in the following processes shown in the flowchart of FIG. 4. In the present embodiment, the processes are carried out while observing the decompressing process in the GIF.

First, upon extracting the compressed code from the compressed image file in the GIF, it is determined if the compressed code is the clear code (S1). If so, the status information in the clear code is saved in the status information extracting section 22 (S2). Thereafter, "1" is added to the control variable ENTRY NUMBER MAX to renew the control variable Entry Number Max (S3) to carry out the decompression of the compressed code in the GIF (S4). The control variable ENTRY NUMBER MAX is a counter ranging from an initial value "0" to a maximum value "256". Namely, up to 256 values can be stored. If there is no strict restriction on the use of the memory, the control variable ENTRY NUMBER MAX may be increased. In this example, when the counter exceeds 256, additional status information cannot be registered.

On the other hand, if it is determined in S1 that the compressed code is not a clear code, the sequence goes directly to S4 to execute the decompressing process in the GIF.

Next, upon receiving a request for scrolling with partial decompression (request for partial display), the stored information searching section 24 searches the status information stored in the information storing section 23. Namely, an appropriate start position for the partial decompression is searched following the processes shown in the flowchart of FIG. 5.

First, the ENTRY NUMBER is obtained by the stored information searching section 24 (S11). This ENTRY NUMBER is the information indicative of the number of the entries in the information storing section 23. Thus, this number of entries is equivalent to the previously described ENTRY NUMBER MAX.

Then, the START PIXEL is obtained (S12). This START PIXEL is computed based on the partial decompression start position in the manner described earlier.

Next, it is checked if the ENTRY NUMBER is 0 (S13). If the ENTRY NUMBER is 0, as no more entry is available in the information storing section 23, the decompression is started from the beginning of the compressed image file in the image portion (S16). On the other hand, if it is determined in S13 that the ENTRY NUMBER is not 0, the offset_pixels belonging to the entry of the large number are compared with the resulting START PIXEL in the image storing section 23 (S14). Then, the offset_pixels to be compared are decremented to the entry including the offset_pixels smaller than the START PIXEL (S15) . Upon finding the entry which satisfies the following condition defined in S14 for the first time, it is the most desirable to start the decompression from the offset_bytes belonging to this entry that is nearest to the START PIXEL as desired. Thus, the sequence goes to S16 to start partial decompression.
Status [ENTRY NUMBER]→offset_pixels<START PIXEL.

Next, in the partial decompression starting section 25, the GIF decompressing section 15 is controlled so as to access the offset position to the compressed image file obtained in the stored information searching section 24 to start partial decompression. The described processes will be explained in reference to the flowchart of FIG. 6.

First, in the partial decompression starting section 25, the status information is loaded from the information storing section 23 (S21). Next, the loaded status information is set to the GIF decompressing section 15 (S22). In this state, as the GIF decompressing section 15 is in the same state as the case of decompressing the compressed image file from the beginning of the file to reach the corresponding position, the decompression can be started after an intermediate access to the compressed image file (S24).

However, as an intermediate access is limited to a position where a clear code is input, it is not necessarily that the clear code is input on a boundary between lines. Therefore, the head end searching decompression is carried out until the GIF decompressing section 15 reaches a predetermined position at which the clear code is input (S23). As described, the same effect as achieved when decompressing the compressed image file from the beginning of the file to reach the predetermined position can be achieved in a reduced number of steps.

Next, the decompression region correcting section 26 computes and determines which section is to be decompressed for the next time in order to shift the current display region by a width as specified and in a direction as specified (right·left·down·up) when scrolling with partial decompression of the compressed image file.

Figure 7:
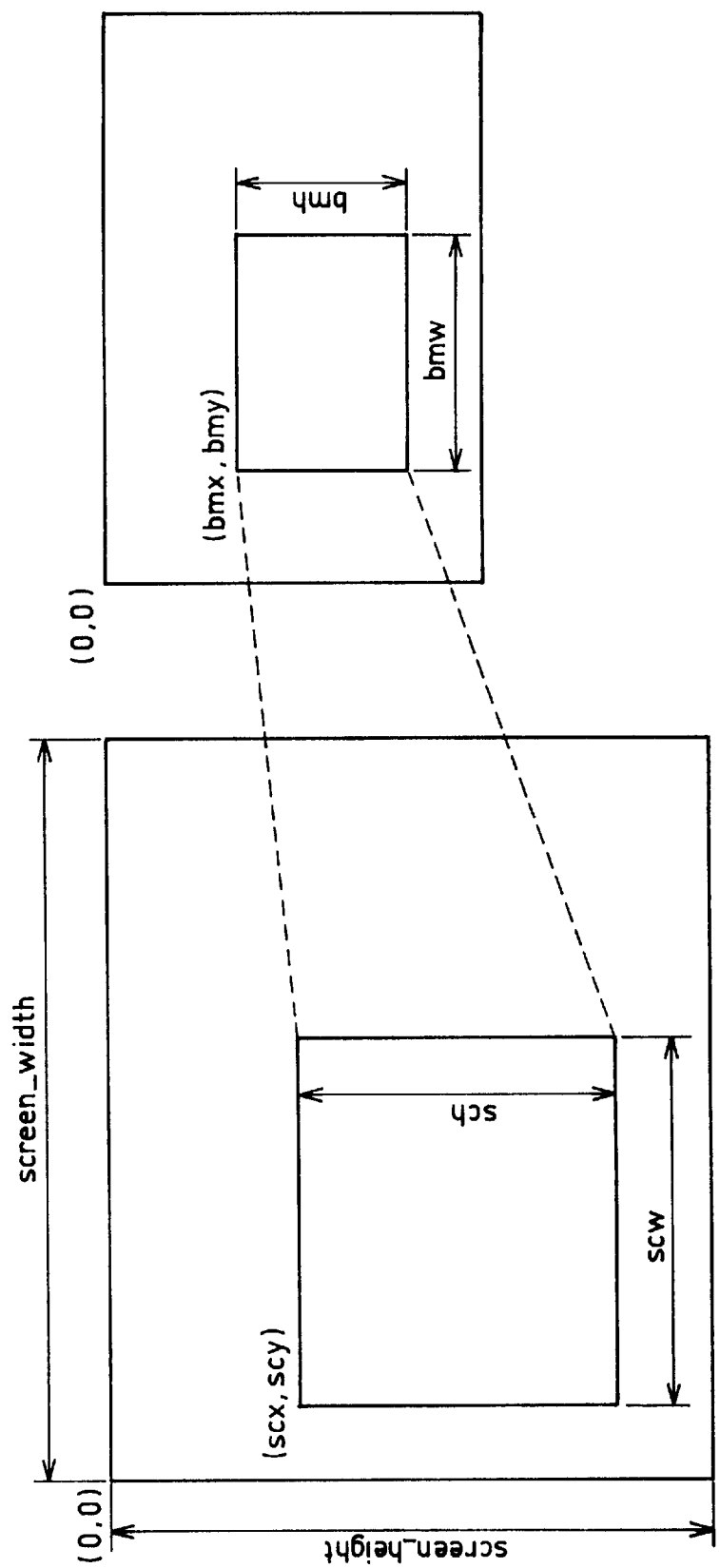
FIG. 7 is an explanatory drawing showing a relationship between an original image (left) to be decompressed and a display image (right)

Next, the explanations will be given through the following example in reference to FIG. 7: the region of scw×sch starting with the coordinate (scx, scy) of the original image wherein a horizontal dot size is the SCREEN WIDTH dot, and the vertical dot size is the SCREEN HEIGHT dot, is projected onto the region of bmw×bmh starting with an arbitral coordinate (bmx, bmy) on the display screen.

In this case, if the condition of either bmw<scw, or bmh<sch holds, the process of reducing the size is carried out by the known technique. Here, when scrolling to the right by vlen dot, the computation is performed as follows:

The X coordinate of the new decompression region=scx+vlen.
The Y coordinate of the new decompression region=scy
The width in a horizontal direction of the new decomposition region = scw
The width in a vertical direction of the new decompression region = sch.

On the other hand, in the case of decompressing only a non-overlapped portion between the current display region and the region to be displayed after shifting the screen by a width and in a direction as requested, as shown in FIG. 8 through FIG. 11, the computation can be carried out based on the program written in, for example, C-language.

As described, upon completing the computation for the region to be decompressed as required, the overlapped portion shifting section 27 shifts an overlapped portion of the image. As described, when scrolling to the right by the vlen dot, the overlapped portion is shifted in the manner shown in FIG. 12.

Next, the control section 28 will be explained.

Without the control section 28, first, the compressed image file are decompressed to the end. Then, the clear code to be appeared and the corresponding status information are all stored, or stored up to the number of entries available in the information storing section 23. Therefore, a long time is required to achieve the first display screen. However, by incorporating the control section 28, as the control is reset immediately after the completion of the decompression required for the display, the described variations in time required for the decompression can be eliminated.

Figure 13:
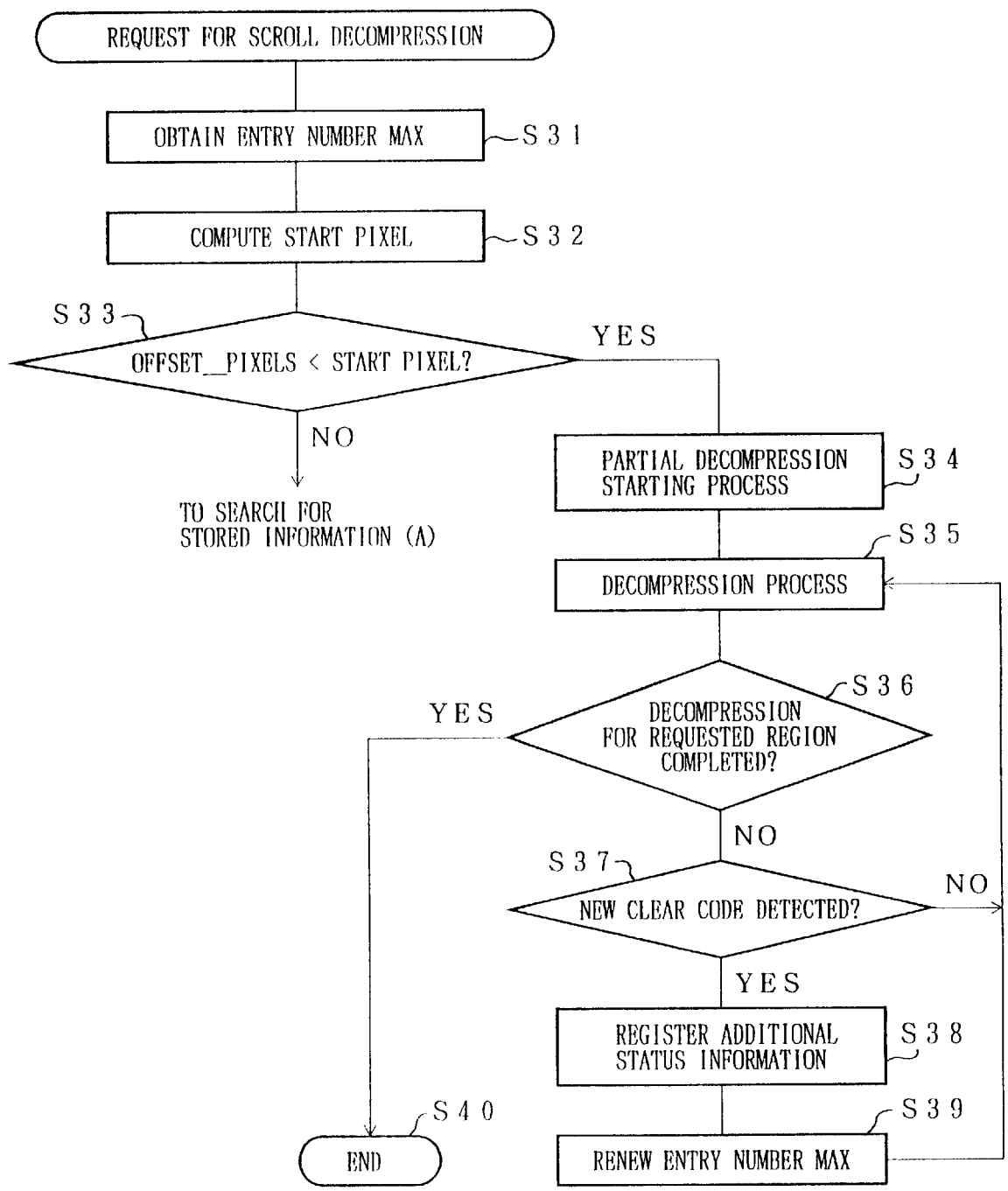
FIG. 13 a flowchart explaining processes of an operation by a control section.

The processes of the operation by the control section 28 will be explained in reference to the flowchart of FIG. 13.

Figure 6:
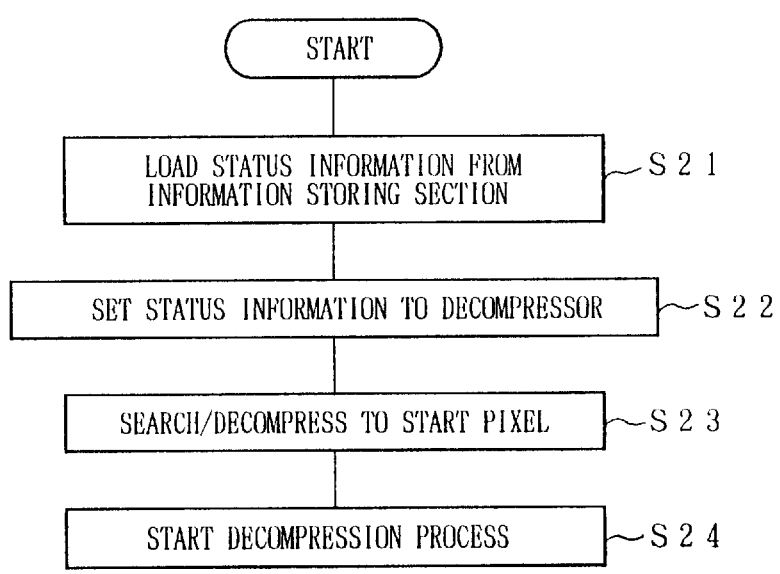
FIG. 6 is a flowchart explaining processes of an operation by the partial decompression starting section.

First, the ENTRY NUMBER MAX is obtained (S31), and the START PIXEL is computed (S32). Then, among the elements stored in the information storing section 23 corresponding to the ENTRY NUMBER MAX, the offset_pixels are extracted to be compared with the START PIXEL with respect to their sizes (S33). If the result of this determination is Yes, the process for starting partial decompression is carried out as shown in the flowchart of FIG. 6 (S34).

Next, the decompression of the compressed image file in the GIF is carried out (S35). Then, upon completing the decompression of each pixel, it is determined if the decompression of the requested region has been completed (S36). If so, it is reset (S40). On the other hand, if not in S36, it is determined if a new clear code is detected (S37). If so, additional status information is registered in the manner explained in reference to FIG. 4 (S38). Then, 1 is added to the ENTRY NUMBER MAX to renew the ENTRY NUMBER MAX (S39).

Figure 5:
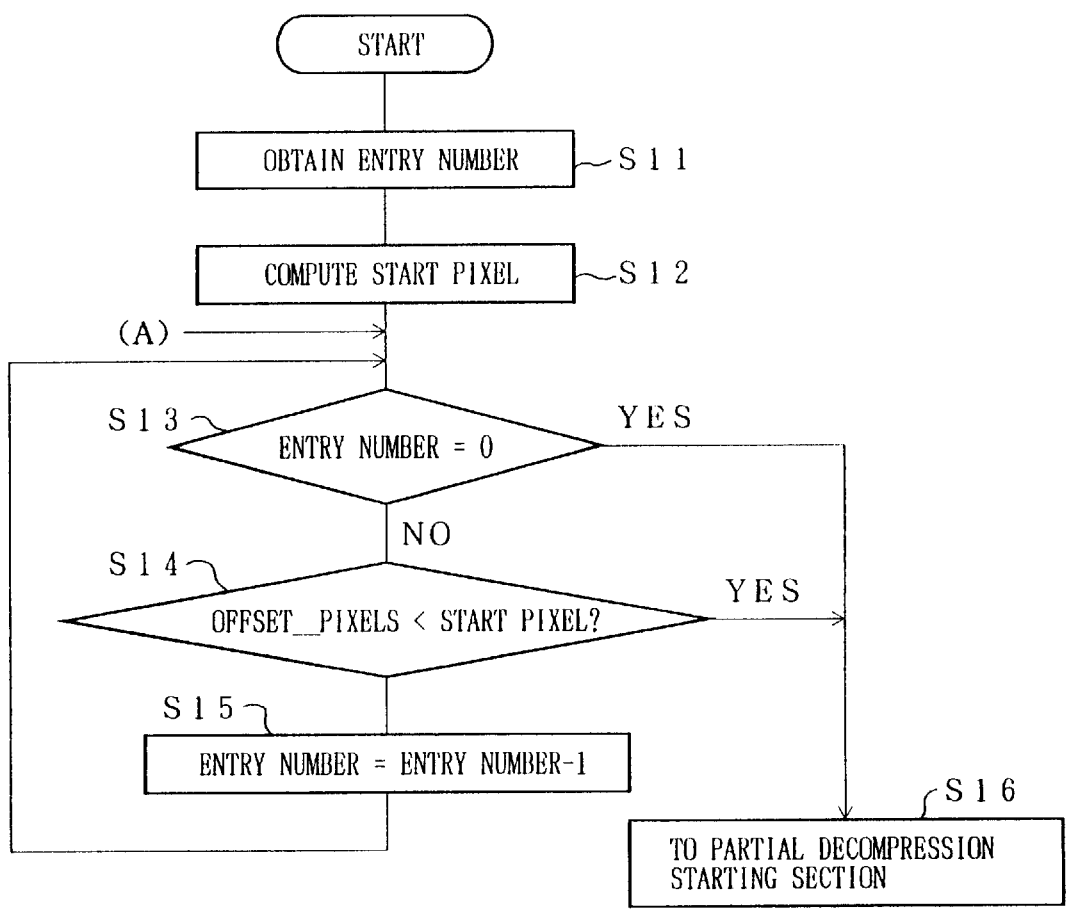
FIG. 5 is a flowchart explaining processes of an operation by the status information extracting section for the GIF decompression system.

On the other hand, if the result of determination in S33 is NO, i.e., if the offset_pixels are larger than the START PIXEL, the stored information searching process is carried out following the processes shown in the flowchart of FIG. 5.

The described operation can be summarized as follows: With respect to the region requested to be decompressed, decompression is started from the information already stored in the information storing section 23. However, as the decompression proceeds, upon reaching a region yet to be decompressed, the decompression proceeds as the information is successively added in the information storing section 23. As a result, such problem that a long time is required for the first decompression can be eliminated, thereby achieving a constant decompression time.

As described, according to the image display device, when carrying out the decompression of the compressed data file of a dictionary self-updating type, first, the clear code detecting section 21 reads the compressed image file from the beginning to the end, and detects the clear code input to the arbitral position in the compressed image file to reset the contents of the self-updating dictionary. Upon detecting the clear code, the status information extracting section 22 extracts the status information including information indicative of a position of the clear code in the compressed image file in the GIF decompressing section 15 in the decompressor.

The detected clear code and the extracted status information of the clear code are stored in the information storing section 23.

Upon receiving a request for a partial decompression of the compressed image file, first, the stored information searching section 24 searches the clear code nearest to the partial decompression start position from the status information stored in the information storing section 23.

Then, the partial decompression starting section 25 accesses the offset position on the compressed image file searched by the stored information searching section 24, and after shifting the bits to obtain the partial decompression start position from the offset position, a decompression is started from this partial decompression start position.

As a result, in the compressed image file of a dictionary self-updating type, the partial decompression can be carried out by making an intermediate access to the compressed image file. Additionally, as the decompression can be carried out partially, a required memory capacity can be reduced to minimum, thereby achieving a high speed decompression.

It is further preferable that the image display device of the present invention having the above arrangement further include the decompression region correcting section 26 for computing a region to be newly decompressed based on a scrolling direction (left, right, up or down) and scrolling width of the given request for scrolling a display in the X-direction or the Y-direction.

According to the described arrangement, when carrying out a display scrolling process in response to a general request for scrolling in a direction as desired (left, right, up or down), the beneficial feature of high speed partial decompression can be appreciated.

It is further preferable that the image display device of the present invention having the described arrangement be further arranged such that the decompression region correcting section 26 computes a region to be newly decompressed in a nonoverlapping portion between the region requested to be scrolled and the region currently displayed, and that the image display device further includes the overlapped portion shifting section 27 for scrolling the current display in the display section 17 by shifting the region currently displayed in the overlapped portion between the region requested to be scrolled and the region currently displayed.

According to the described arrangement, decompression by an intermediate access can be performed effectively since only a minimum region required to be decompressed for scrolling is computed by the decompression region correcting section 26.

Moreover, as described, overlapped portion shifting section 27 eliminates the need of decompressing the overlapped portion repeatedly, thereby achieving a high speed decompression.

According to the described arrangement, as only the region required to be decompressed for scrolling is decompressed, scrolling can be carried out with an improved efficiency.

It is further preferable that the image display device of the present invention includes the temporary memory section 12 for temporarily storing the compressed code.

According to the described arrangement, for example, by storing the compressed code of an image portion corresponding to the image data in the temporary memory section 12, a decompressing process of an improved efficiency can be achieved.

It is also preferable that the image display device of the present invention be arranged so as to further include the central processing section 14 for interpreting the image data by reading out the image data stored in the temporary memory section 12, and executing displaying of an image.

According to the described arrangement, as the image data can be read into the temporary memory section 12 under the control of the central processing section 14, the decompressing process can be carried out with a still improved efficiency.

It is also preferable that the image display device of the present invention adopts the Graphic Interchange Format (GIF) for displaying an image in the display section 17.

According to the described arrangement, as the GIF is an image forming system for displaying an image based on a painting program using a color palette, an image corresponding to data input can be displayed in a display section of information apparatuses such as a personal computer, etc.

It is further preferable that the image display section of the present invention adopts the Lempel Ziv Welch system as the compression/decompression system of a dictionary self-updating type.

According to the described arrangement, since the compression and decompression of data are performed by detecting the repetitive character string which updates a dictionary both when compressing and decompressing, and an improved compression ratio can be achieved. Moreover, the compression/decompression process, especially, the decompression process can be carried out at higher speed.

It is still preferable that the image display device of the present invention be arranged such that the clear code includes a clear code value corresponding to the number of colors used in the displayed image.

According to the described arrangement, as the clear code corresponding to the number of colors of the displayed image is set, an optimal clear code can be set.

Another image display of the present invention includes in addition to the described arrangement, a control section 28 which, in response to the request for partial decompression of the compressed data, controls the clear code detecting section 21 so as to detect the clear code with respect to a predetermined region as requested in the compressed image file and controls the partial decompression starting section 25 so as to carry out partial decompression with respect to the predetermined region as requested, while, upon completion of the partial decompression with respect to the predetermined region as requested, the control section 28 controls the stored information searching section 24 so as to carry out an additional search of a clear code with respect to a predetermined additional region as requested and controls the partial decompression starting section 25 so as to carry out partial decompression.

According to the described conventional image display device, in order to enable high speed partial decompression, the compressed image file is once read in from the beginning to the end, and the information is detected and extracted as requested. Therefore, even with respect to the image that is to be displayed only partially, a long time is required for the initial process of detecting and extracting the information as requested, i.e., the status information from the entire compressed image file.

For example, assume that it takes 10 seconds for detecting and extracting necessary information of an image having a dot size of 1024×1024, although it takes only 2.5 seconds for displaying a region of an upper left corner having a dot size of 256×256, it takes 10 seconds for the initial process of detecting and extracting the information as required.

In contrast, according to the image display device of the present invention, upon receiving a request for partial decompression of compressed data, the control section 28 controls, with respect to a predetermined requested region in the compressed image file, the clear code detecting section 21 so as to search for a clear code and controls the partial decompression starting section 25 so as to carry out partial decompression, and upon completion of the partial decompression with respect to the predetermined region as requested, the control section 28 controls, with respect to the predetermined additional region as requested, the stored information searching section 24 to search for an additional clear code and controls the partial decompression starting section 25 to carry out partial decompression with respect to the predetermined additional region as requested.

Namely, with respect to the region requested to be decompressed, decompression is started from the information already stored in the information storing section 23. However, as the decompression proceeds, upon reaching a region yet to be decompressed, the decompression proceeds as the information is successively added in the information storing section 23.

According to the described arrangement, the control section 28 reads in the status information based on the clear code one after another. As this eliminates such problem that a long time is required for extracting the first status information resulting from reading contents in other region than the region to be decompressed as requested, a constant decompression time can be achieved.

It is preferable that the image display device of the present invention having the above arrangement include the decompression region correcting section 26 for computing a new region to be decompressed based on a scrolling direction (left, right, up and down) and scrolling width of the given request for scrolling a display in the X-direction and the Y-direction. It is further preferable that the decompression region correcting section 26 computes a region to be decompressed in a non-overlapped portion between the region to be scrolled as requested and the display being currently displayed, and that the image display device further includes the overlapped portion shifting section 27 for scrolling the current display in the display section 17 by shifting the display region in the overlapped portion between the region to be scrolled as requested and the region currently displayed.

According to the described arrangement, when carrying out a display scrolling process for decompressing the region requested to be decompressed by reading in the status information based on the clear code one after another in response to a request for scrolling in a direction as desired (left, right, up or down), the beneficial feature of high speed partial decompression can be appreciated.

Furthermore, as only the region required to be decompressed for scrolling is decompressed, a scrolling process of an improved efficiency can be achieved.

In addition, the image display device of the present invention also can be arranged so as to include a display section 17 for displaying image data, a GIF decompressing section 15 for restoring image data from compressed data in a compressed image file by a decompression based on a self-updating dictionary, the compressed image file including a clear code for resetting contents of a self-updating dictionary and status information including information indicative of position of the clear code in an image data corresponding to a position of the clear code in the compressed data, a clear code detecting section 21 for detecting the clear code, the status information extracting section 22 for extracting the status information, and a partial decompression starting section 25 for controlling the decompressing section to make an intermediate access with respect to the compressed image file based on the clear code and the status information in response to the partial display request upon receiving a request for a partial display with respect to the compressed image file.

Further, a first updating dictionary being updated in data compression and a second updating dictionary being updated in data decompression can be included in the above-mentioned dictionary.

According to the above arrangement, in the compressed image file of a dictionary self-updating type, the partial decompression also can be carried out by making an intermediate access to the compressed image file. Additionally, as the decompression can be carried out partially, a required memory capacity can be reduced to minimum, thereby achieving a high speed decompression.

The image display device of the present invention having the above arrangement is best suited for use in information apparatus having a limited memory capacity for which a high speed image display is demanded such as personal computers, workstations, and especially a portable information terminals, etc.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An image display device, comprising:

a display section for displaying image data;

a decompressor for decompressing a compressed image file that is a file of compressed data of a dictionary self-updating type, said decompressor making said compressed image file the image data;

a clear code detecting section for detecting a clear code that is input in an arbitrary position beforehand in said compressed image file so as to reset contents of a self-updating dictionary when carrying out decompression;

a status information extracting section for extracting status information in said decompressor upon detecting said clear code, said status information including information indicative of a position of said clear code in said compressed image file;

an information storing section for storing said clear code as detected and the status information of said clear code as extracted;

a stored information searching section for searching a clear code nearest to a partial decompression start position from its status information stored in said information storing section upon receiving a request for partial decompression of the compressed data; and a partial decompression starting section, which makes an access to an offset position in the compressed image file as searched by said stored information searching section, shifts bits to obtain the partial decompression start position from said offset position, and subsequently starts decompression from the partial decompression start position.

2. The image display device as set forth in claim 1, further comprising:

a decompression region correcting section for computing a region to be newly decompressed based on a direction of scrolling, i.e., left, right, up or down, a width of scrolling in response to a request for scrolling a display in an X direction or a Y direction.

3. The image display device as set forth in claim 2, wherein said decompression region correcting section computes the region to be newly decompressed in a non-overlapped portion between a region to be scrolled as requested and a current display region, said image display device further comprising:

an overlapped portion shifting section for scrolling a display screen in a display section by shifting the current display region with respect to an overlapped portion between the region to be scrolled as requested and the current display region.

4. The image display device as set forth in claim 3, further comprising:

a temporary memory section for temporarily storing said compressed data.

5. The image display device as set forth in claim 4, further comprising:

a central processing section for interpreting image data that is read out and is stored in said temporary memory section and executing displaying of an image.

6. The image display device as set forth in claim 5, wherein an image is displayed in said image display section according to a Graphic Interchange Format.

7. The image display device as set forth in claim 6, wherein a compression/decompression system of a dictionary self-updating type is a Lempel Ziv Welch system.

8. The image display device as set forth in claim 7, wherein said clear code includes clear code values corresponding to a number of colors used in the image to be displayed.

9. An image display device, comprising:

a display section for displaying image data;

a decompressor for decompressing a compressed image file that is a file of compressed data of a dictionary self-updating type, said decompressor making said compressed image file the image data;

a clear code detecting section for detecting a clear code that is input in an arbitrary position beforehand in said compressed image file so as to reset contents of a self-updating dictionary when carrying out decompression;

a status information extracting section for extracting status information in said decompressor upon detecting said clear code, said status information including information indicative of a position of said clear code in said compressed image file;

an information storing section for storing said clear code as detected and the status information of said clear code as extracted;

a stored information searching section for searching a clear code nearest to a partial decompression start position from its status information stored in said information storing section upon receiving a request for partial decompression of the compressed data;

a partial decompression starting section for accessing an offset position in the compressed image file as searched by said stored information searching section, said partial decompression starting section shifting bits to obtain the partial decompression start position from said offset position, and subsequently starting decompression from the partial decompression start position; and a control section which, in response to a request for partial decompression of the compressed data, controls said clear code detecting section so as to detect the clear code with respect to a predetermined region as requested in said compressed image file and controls said partial decompression starting section so as to carry out partial decompression with respect to the predetermined region as requested, while, upon completion of the partial decompression with respect to the predetermined region as requested, controls said stored information searching section so as to carry out an additional search of a clear code with respect to a predetermined additional region as requested and controls said partial decompression starting section so as to carry out partial decompression with respect to the predetermined additional region as requested.

10. An image display device, comprising:

a display section for displaying image data;

a decompressor for restoring image data from compressed data in a compressed image file by a decompression based on a self-updating dictionary, said compressed image file including a clear code for resetting contents of a self-updating dictionary and status information including information indicative of position of said clear code in an image data corresponding to a position of said clear code in said compressed data;

a detecting section for detecting said clear code and said status information; and a partial decompression starting section for controlling said decompressing section to make an intermediate access with respect to said compressed image file based on said clear code and said status information in response to said partial display request upon receiving a request for a partial display with respect to said compressed image file.

11. The image display device as set forth in claim 10, wherein said dictionary includes a first updating dictionary being updated in data compression and a second updating dictionary being updated in data decompression.

* * * * *